US010324145B2

(12) United States Patent
Leussler et al.

(10) Patent No.: US 10,324,145 B2
(45) Date of Patent: Jun. 18, 2019

(54) TRANSVERSE-ELECTROMAGNETIC (TEM) RADIO-FREQUENCY COIL FOR MAGNETIC RESONANCE

(71) Applicant: KONINKLIJKE PHILIPS N.V., Eindhoven (NL)

(72) Inventors: Christoph Leussler, Hamburg (DE); Daniel Wirtz, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 968 days.

(21) Appl. No.: 14/350,664

(22) PCT Filed: Oct. 3, 2012

(86) PCT No.: PCT/IB2012/055308
§ 371 (c)(1),
(2) Date: Apr. 9, 2014

(87) PCT Pub. No.: WO2013/054235
PCT Pub. Date: Apr. 18, 2013

(65) Prior Publication Data
US 2014/0253127 A1    Sep. 11, 2014

Related U.S. Application Data

(60) Provisional application No. 61/545,221, filed on Oct. 10, 2011.

(51) Int. Cl.
*G01R 33/34* (2006.01)
*G01R 33/345* (2006.01)

(52) U.S. Cl.
CPC . *G01R 33/34092* (2013.01); *G01R 33/34046* (2013.01); *G01R 33/3453* (2013.01); *G01R 33/3456* (2013.01)

(58) Field of Classification Search
CPC ........ G01R 33/34046; G01R 33/34092; G01R 33/341; G01R 33/3453; G01R 33/3456; G01R 33/34076
See application file for complete search history.

(56) References Cited

U.S. PATENT DOCUMENTS 4,746,866 A    5/1988   Roschmann
7,202,668 B2   4/2007   Ludwig
(Continued)

FOREIGN PATENT DOCUMENTS

WO    2006095297 A1    9/2006
WO    2008135883 A1   11/2008
(Continued)

OTHER PUBLICATIONS

Vernickel, P. et al "Eight-Channel Transmit/Receive Body MRI COil at 3T", Magnetic Resonance in Medicine, vol. 58, 2007, pp. 381-389.
(Continued)

*Primary Examiner* — Rishi R Patel

(57) ABSTRACT

A transverse-electromagnetic (TEM) radio-frequency coil (1) for a magnetic resonance system, especially for a magnetic resonance imaging system, includes a coil (1) in which at least one of the opposite end regions of the elongate strip section (4) of each TEM coil element (2) has a lateral extension (6) transverse to a longitudinal extent of the strip section (4). These lateral extensions (6) combine with strip sections (4) to form L- or U-shaped TEM coil elements (2) and provide 'ring-like' current contributions resulting in a reduction of the z-sensitivity compared with a conventional TEM coil. The result is a coil array having TEM coil elements (2) that provide smaller sensitivity profiles in the z-direction, yet preserve the characteristics of a well-defined RF ground, e.g. via an RF shield or screen (3). The reduced
(Continued)

field of view in z-direction not only reduces noise reception but also reduces the SAR generated in those regions during transmission.

18 Claims, 6 Drawing Sheets

(56) References Cited

U.S. PATENT DOCUMENTS

| | | | |
|---|---|---|---|
| 7,508,210 B2 | 3/2009 | Morich et al. | |
| 7,525,313 B2 | 4/2009 | Boskamp | |
| 7,633,293 B2 | 12/2009 | Olson | |
| 7,683,623 B2 | 3/2010 | Zhai | |
| 7,755,357 B2 | 7/2010 | Holle | |
| 8,659,296 B2 | 2/2014 | Leussler | |
| 2005/0237060 A1* | 10/2005 | Freytag | G01R 33/34061 324/318 |
| 2006/0277749 A1 | 12/2006 | Zhang | |
| 2007/0079253 A1* | 4/2007 | Leussler | G01R 33/34046 715/784 |
| 2008/0129292 A1* | 6/2008 | Leussler | G01R 33/34046 324/318 |
| 2008/0129298 A1* | 6/2008 | Vaughan | G01R 33/5612 324/322 |
| 2008/0161675 A1 | 7/2008 | Harvey | |
| 2009/0192382 A1* | 7/2009 | Nistler | G01R 33/34046 600/410 |
| 2012/0146643 A1* | 6/2012 | Saha | G01R 33/34076 324/318 |
| 2013/0119991 A1* | 5/2013 | Soutome | A61B 5/055 324/322 |

FOREIGN PATENT DOCUMENTS

| | | | | |
|---|---|---|---|---|
| WO | WO 2009125320 A1 * | 10/2009 | | G01R 33/34046 |
| WO | 2009134920 A2 | 11/2009 | | |
| WO | 2010018535 A1 | 2/2010 | | |
| WO | 2010045457 A2 | 4/2010 | | |

OTHER PUBLICATIONS

Leussler, Christoph et al "U-SHaped Ladder Tem-Coil Structure with Truncated Sensitivity Profile in-Direction for High Field MRI", Proc. Intl. Society Magnetic Resonance in Medicine, vol. 20, 2012, p. 2805.

Wu, Bing et al "Capacitively Decoupled Tunable Loop Microstrip (TLM) Array at 7T", Magnetic Resonance Imaging, vol. 25, 2007, pp. 418-424.

Findeklee, C. et al "Efficient Design of a Novel Double Tuned Quadrature Headcoil for Simultaneous 'H and "P MRI/MRS at 7T", Proc. Intl. Society Magnetic Resonance in Medicine, vol. 13, 2005, p. 891.

Boskamp, E. et al "Efficiency of a 3T Whole Body 16 Channel TEM Transmit Array", Proc. Intl. Society Magnetic Resonance in Medicine, vol. 16, 2008, p. 1094.

* cited by examiner

TRANSVERSE-ELECTROMAGNETIC (TEM) RADIO-FREQUENCY COIL FOR MAGNETIC RESONANCE

CROSS-REFERENCE TO PRIOR APPLICATIONS

This application is the U.S. National Phase application under 35 U.S.C. § 371 of International Application No. PCT/IB2012/055308, filed on Oct. 3, 2012, which claims the benefit of U.S. Provisional Patent Application No. 61/545,221, filed on Oct. 10, 2011. These applications are hereby incorporated by reference herein.

FIELD OF THE INVENTION

The present invention relates to the field of magnetic resonance (MR), and more particularly to transverse-electromagnetic (TEM) radio-frequency (RF) coils for use in MR applications, as well as to a magnetic resonance (MR) system incorporating such coils.

BACKGROUND OF THE INVENTION

MR systems, and particularly magnetic resonance imaging (MRI) systems, frequently employ quadrature birdcage coils (QBCs), which have the advantage of a shorter field of view (FOV) in the z-direction (i.e. in the axial direction) while providing a higher signal-to-noise ratio (SNR) and also having lower total RF power requirements compared to TEM coils. As birdcage coils float with respect to RF ground, the supply or feed of RF power in QBC-based MR systems is problematic, however, due to hot RF connections. Further, this problem does not provide reliable basis for EM simulation of such a device. Particularly with degenerate birdcage coils, the RF cable connections are difficult to define and specify for simulations regarding the management of the specific absorption rate (SAR) of RF energy by patients in a MR system.

SUMMARY OF THE INVENTION

It is an object of the present invention to provide a new and improved radio-frequency (RF) coil for use in magnetic resonance (MR) applications which addresses the disadvantages and limitations of conventional birdcage coils discussed above.

According to one aspect, therefore, the invention provides a transverse-electromagnetic (TEM) radio-frequency coil for a magnetic resonance system, and especially for a magnetic resonance imaging system. The radio-frequency coil comprises a plurality of TEM coil elements, each having an elongate coil strip section, wherein the plurality of TEM coil elements are arranged such that the elongate strip sections are substantially parallel and spaced apart in and/or around a space or volume for receiving a subject to be examined, and wherein at least one of the opposite end regions of the elongate strip section of each TEM coil element has a lateral coil extension transverse to a longitudinal extent of the respective strip section.

In one particular embodiment, only one of the opposite end regions of the elongate strip section of each TEM coil element has a lateral extension, thereby providing each TEM coil element with a generally L-shaped configuration. In a preferred embodiment, however, both of the opposite end regions of the strip section of each TEM coil element has a lateral extension transverse to the longitudinal extent of the strip section, which may thereby provide each TEM coil element with a generally U-shaped configuration. It will be noted that references to an L-shaped or a U-shaped configuration are to be understood in a general sense only. As such, these terms are not intended to imply that the sides or the base of the L-shape or the U-shape have specific relative lengths or a specific geometric relationship. Rather, they are such as simply to create the general impression of that shape.

Thus, with the present invention, the elements of a conventional or classical TEM coil are modified in such a way, that the strip section of each TEM coil element is extended laterally (e.g. azimuthally or circumferentially) at either or both of its opposite ends before connection to an RF shield or screen. Each of these extensions or additional parts of the coil elements has been found to produce field contributions that lead to reduced sensitivity along the z-axis during signal transmission and therefore to less noise pickup from regions outside the imaging field of view during signal reception. Thus, the reduced FOV in z-direction for the proposed TEM coil not only reduces noise reception from regions outside the FOV (as for a QBC) but also reduces the SAR generated in those regions during transmission. Furthermore, the proposed TEM coil generates a significant reduction in the RF-power required for generating a given B-field, which may drastically reduce costs compared to a QBC-based MR-system.

In a preferred embodiment, the space or volume for receiving the subject to be analyzed is formed by a cavity (for example, in a housing of a MR system) that may be cylindrical or tubular or otherwise generally prismatic in shape. The elongate strip sections of the TEM coil elements are arranged around the cavity to extend in a generally axial direction, and preferably parallel to a central axis (i.e. the z-axis) of the cavity, although they may alternatively be arranged at a predefined angle, preferably less than about 45 degrees to the central axis or z-axis. Furthermore, the strip sections of the plurality of TEM coil elements are preferably spaced apart from one another at substantially uniform intervals around the volume or cavity.

In a preferred embodiment, each lateral extension from the strip section of each TEM coil element extends in a direction around or generally circumferentially of the space or volume for receiving the subject. That is, the lateral extensions extend in a direction transverse to the z-axis or axial extent of the cavity and in a direction around a periphery or circumference of the volume or cavity. In a particularly preferred embodiment, each of the lateral extensions is directed azimuthally around the central axis or z-axis of the volume or cavity. Accordingly, where the volume for receiving the subject to be analyzed is formed by a cylindrical or tubular cavity, the lateral extensions from the strip section of each TEM coil element may form ring sections, which when considered in combination together extend around the cavity, albeit perhaps in a discontinuous or interrupted band. The angular extent of each lateral extension or ring section around the z-axis will typically vary depending upon the design of the TEM coil, and in particular upon the number of coil elements spaced around the (e.g. cylindrical) volume. The angular extent a of each lateral extension about the z-axis is typically less than or equal to the ratio of 360° to the number of coil elements n around the z-axis ($\alpha \leq 360°/n$). Thus, for example, in a coil design having 8 coil elements spaced around the z-axis, each lateral extension or ring section will typically have an angular extent of less than about 45°. In another particular embodiment, one side of the coil may have a continuous ring section and other side has ring compensation for a specifically tailored $B_1$-field. In yet another alternative embodiment, each of the lateral extensions may extend circumferentially around the volume or cavity other than azimuthally, i.e. at an angle other than 0 degrees (for example, in the range from 0 to 45 degrees) to the central axis or z-axis.

In a preferred embodiment, the lateral extensions from opposite end regions of the strip section of each TEM coil element extend in the same circumferential direction, such that the lateral extensions and the strip section of each TEM coil element together form a basic U-shaped configuration. The strip section and the lateral extensions of each TEM coil element may be configured to have the same width. Alternatively, the lateral extensions of each TEM coil element may have different widths compared to the width of the respective strip section.

In a preferred embodiment, the lateral extensions from the strip section of each U-shaped TEM coil element extend substantially parallel with one another and towards the strip section of an adjacent one of the plurality of TEM elements. In this regard, the lateral extensions of the TEM coil elements may be aligned with one another in the circumferential direction, or alternatively may be offset from one another in the circumferential direction (i.e. not aligned). In one particular embodiment, the lateral extensions from the strip section of each TEM coil element at least partially overlap with the strip section of a neighboring or adjacent one of the plurality of TEM elements in the coil. The lateral extensions may be of the same length or may have differing lengths.

In a preferred embodiment, each of the plurality of TEM coil elements is encompassed by an electrically conductive shield or screen which forms an electrical ground for radio-frequency radiation. In particular, the shield or screen may encompass the plurality of TEM coil elements collectively. The lateral extensions from the strip section of each TEM coil element are preferably electrically connected with the shield or screen, for example, via any one or more of a variety of electrical components selected from the group of capacitors, inductors, impedance circuits or other circuits, as known per se in the art. In this manner, the TEM coil has a defined RF ground to the RF shield or screen, which is not the case for a QBC. The defined RF ground provides a solid reference for detuning circuits, feeding cables and pick-up coils used for RF-safety purposes. Common mode cable currents are prevented and mutual coupling is totally defined. This also gives a reliable reference for RF safety simulations of the subject (patient) in a loaded MR antenna system, which is especially critical for SAR estimations.

It will be appreciated by persons skilled in the art that the invention concerns a TEM coil structure, which may also be considered to include a stripline coil element or a dipole element with capacitive end loading. That is, it will be understood that different terms, such as stripline resonator or even dipole resonator (e.g. capacitively shortened) may be employed in association with the concept proposed herein. In this connection, in a preferred embodiment, dielectric material may be provided between the strip sections and the electrical ground of the shield or screen. Furthermore, dielectric material may be provided between strip sections and a subject to be imaged. The use of dielectric material between the RF shield or screen and strip conductor and/or the use of dielectric material between strip conductor and the subject to be imaged can be beneficial for shielding the electric field.

While the TEM coil of the invention may typically be configured as a one channel coil for a whole-body MR-scanner, there is currently a trend toward multi-channel systems for signal transmission. Multi-channel signal reception, on the other hand, has been standard for quite some time. For multi-channel transmission, both birdcage coils and TEM coils have to be decoupled in order to provide independent transmission elements, and thereby provide a coil array. Significantly, this decoupling has been found to be substantially simplified using a TEM coil according to the invention compared to a birdcage coil, while nevertheless preserving the improved performance of the inventive TEM coil compared to a standard TEM coil. In a preferred embodiment, therefore, all of the elements of the proposed TEM coil structure can be fully decoupled and used as a multi-channel transmit coil array. The lateral extensions may provide de-tuning at the opposite end regions of the strip sections, e.g. via PIN switches to the electrical ground of the shield or screen. This kind of de-tuning is easier to realize than the de-tuning a floating birdcage coil, which typically occurs in the center of the birdcage coil rods. Nevertheless, de-tuning of the TEM coil of the invention may also be realized in the center of each strip section, as is the case in QBCs. Furthermore, multiple de-tuning positions are also an option.

In a preferred embodiment, the lateral extensions and the strip sections have different distances to the electrical ground which helps reduce e-fields resulting from discrete capacitors either in the strip sections or the lateral extensions. The lateral extensions are preferably lowered closer to the RF shield or screen in order to reduce e-fields associated with the currents therein. Furthermore, decoupling of the individual coil elements may be achieved using any of a variety of decoupling circuits, such as capacitive, inductive, or Quarter wave line circuits.

In a preferred embodiment, two or more TEM coil elements are arranged adjacent one another and spaced apart along the z-axis, such that the coil includes at least two circumferential rows of TEM coil elements in the the z-direction. For example, two L-shaped coil elements may be arranged adjacent one another and spaced apart along the z-axis, such that the two L-shaped coil elements together form a U-shape in the coil structure, i.e. with aligned strip sections forming the base of the U-shape. In this manner, the coil elements may be segmented in the z-direction. Further, it will be appreciated that any one or more of a variety of electrical components selected from the group of capacitors, inductors, impedance circuits or other circuits may be connected in series along the strip section of each TEM element, e.g. for achieving double resonance, or for efficiency with a field strength of 7 Tesla or higher.

With respect to the strip sections of the coil elements in the TEM coil of the invention being arranged parallel, it will be appreciated by persons skilled in the art that an exact or precise parallel arrangement is not required. As such, the use of the term "parallel" herein is to be understood as having only a general or approximate meaning. It will also be noted that the strip section of each coil element need not necessarily be straight, although in practice it typically will be. That is, coil structures that embody the inventive concept could be envisaged in which the strip sections of the coil elements are, for example, curved.

The present invention thus proposes a TEM-type radio-frequency coil concept which is suitable for use in a range of MR systems. For example, the TEM coil concept of the invention may be employed for body imaging in whole body MR-scanners (eg. multi-element transmit applications at high fields), in head-coils for head examinations, and in specialized small-coil devices, e.g. for examining small animals in veterinarian applications. Also, the coil need not be cylindrical, and could even by planar. Especially in high field MRI (≥7 T) local transmitters are used. These could possibly also be of the proposed type. The RF-shield would then be a dedicated ground-plane close to the coil elements. TEM coils offer a different approach to body imaging compared to the typically used quadrature birdcage coil (QBC). Especially when employed in high field systems, QBCs operated in classical quadrature drive are no longer capable of producing homogeneous spin excitation and signal reception due to dielectric effects within the patient body and travelling wave effects within the analysis cavity.

Although conventional TEM coils typically have a larger sensitivity profile in the z-direction, which can lead to safety issues with the specific absorption rate (SAR) of RF energy by patients (particularly in the head region) and can also reduce image quality due to additional sensitivity to noise pickup, the inventive concept is able to overcome these issues. The proposed concept provides L-shaped or U-shaped TEM-type coil elements having truncated or reduced sensitivity profiles in the z-direction which resolves the problems mentioned and yet still preserves the characteristics of the TEM coil having a well-defined RF ground (i.e. via an RF shield or screen). The lateral extensions of the U-shaped TEM coil elements have been found to provide 'ring-like' current contributions resulting in a reduction of the z-sensitivity encountered in a conventional TEM coil. Thus, the proposed TEM coil concept incorporates circumferential or ring sections, which provide a short FOV and a defined RF ground better suited for simulations, especially in relation to SAR issues. As such, the concept provides a solid basis for a safe RF high field MR system, as safe patient management is based on a well defined RF system regarding array antenna element coupling (impedance matrix) and sensor data (pick-up coils). As such, the invention provides an advantageous alternative to the quadrature birdcage coil often employed in magnetic resonance imaging applications.

According to another aspect, the invention provides a magnetic resonance system, especially a magnetic resonance imaging system, which incorporates a transverse-electromagnetic (TEM) radio-frequency coil of the invention as described above.

BRIEF DESCRIPTION OF THE DRAWINGS

These and other aspects of the invention will be apparent from and elucidated with reference to the embodiments described hereinafter. In the drawings.

DETAILED DESCRIPTION OF EMBODIMENTS

Figure 1:
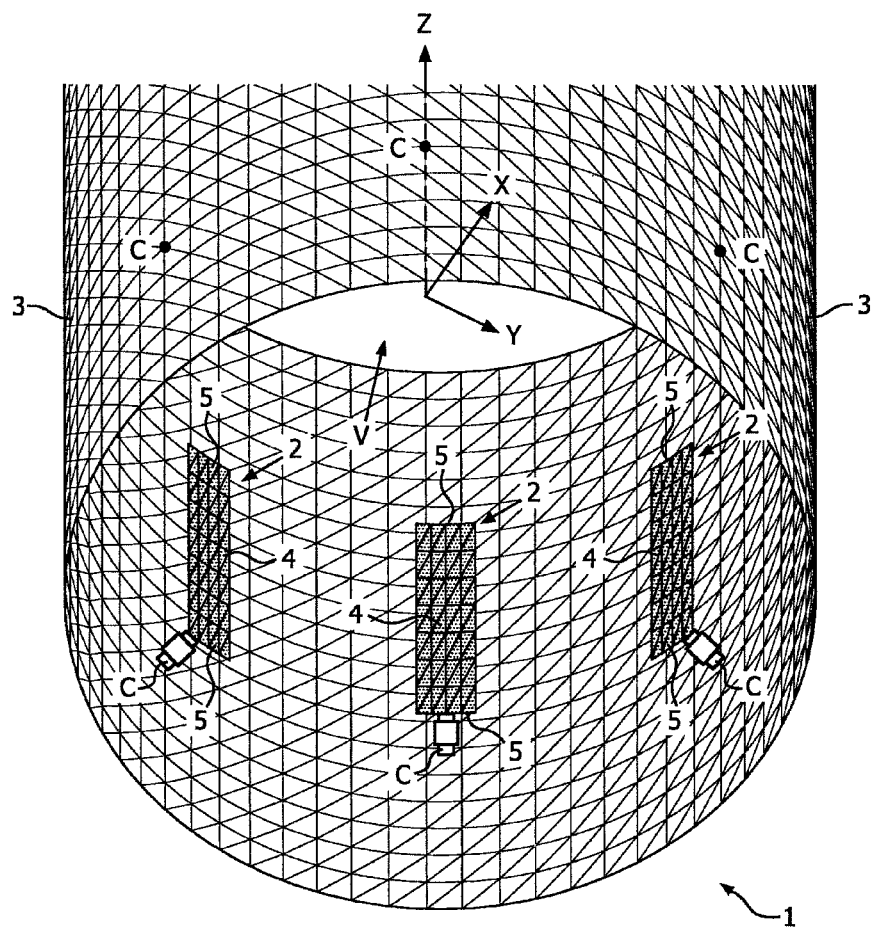
FIG. 1 shows a conventional TEM coil.

FIG. 1 shows a conventional transverse-electromagnetic (TEM) radio-frequency (RF) coil $1_C$ for a magnetic resonance system, such as an MRI system. The conventional TEM coil $1_C$ comprises a plurality of TEM coil elements 2 arranged within and encompassed by an RF shield 3 in the form of a cylindrical screen which functions as an RF ground for the coil $1_C$. A central axis of the cylindrical RF screen 3 corresponds to the z-axis of the coil $1_C$, as denoted by the Cartesian coordinates shown in FIG. 1. Each of the plurality of TEM coil elements 2 comprises an elongate coil strip section 4, and the TEM coil elements 2 are arranged such that the strip sections 4 are essentially parallel and spaced apart from one another at regular intervals around the z-axis inside the RF screen 3. Because the RF screen 3 in this example is circularly cylindrical, all of the strip sections 4 of the TEM coil elements 2 have basically the same radial spacing from the z-axis of the coil $1_C$. In this embodiment, the coil elements 2 are not decoupled. Rather, coupling connections C to ground actually close a loop formed by the strip sections 4 and the RF-screen 3 in a resonant way. When current is fed to each coil element 2, e.g. via the connection or supply point C in the foreground, the current flows across the strip section 4 and through another connection back to ground on the RF-screen 3. Thus each coil element 2 forms a loop, part of which is comprised by the RF-screen.

Figure 4:
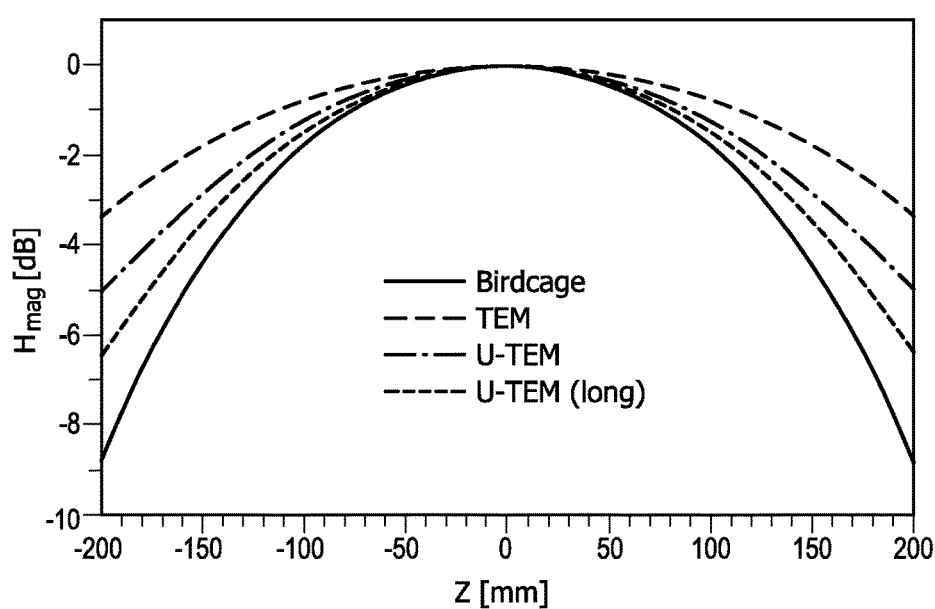
FIG. 4 shows the calculated field of view (FOV)—more particularly, the magnitude of the $B_1$-field on the vertical axis plotted vs. the z-coordinate—for different coil designs.

For the purpose of imaging a subject S (typically part of a patient's body) in the MR system, the TEM coil elements 2—and particularly the strip sections 4—are spaced around a volume V within the RF screen 3 that is configured to receive the subject S to be imaged and analyzed. As noted above, the conventional TEM coil $1_C$ has the disadvantage of a relatively extended sensitivity profile in the z-direction, which can lead to safety issues with the specific absorption rate (SAR) of RF energy by the patient (e.g. in the head region) and can also reduce image quality due to additional sensitivity to noise being picked up. This is apparent from drawing FIG. 4 which shows the calculated field of view (FOV) and, more particularly, the magnitude of the $B_1$-field on the vertical magnet axis plotted vs. the z-coordinate, for different coil designs including the conventional TEM coil $1_C$ of FIG. 1 shown in the line denoted as "TEM" and plotted with circles. The contrast with the relatively narrow sensitivity profile in the z-direction provided by a birdcage-type coil is also apparent from FIG. 4, which illustrates the FOV for a QBC in the line denoted as "Birdcage" and plotted with squares.

Figure 2:
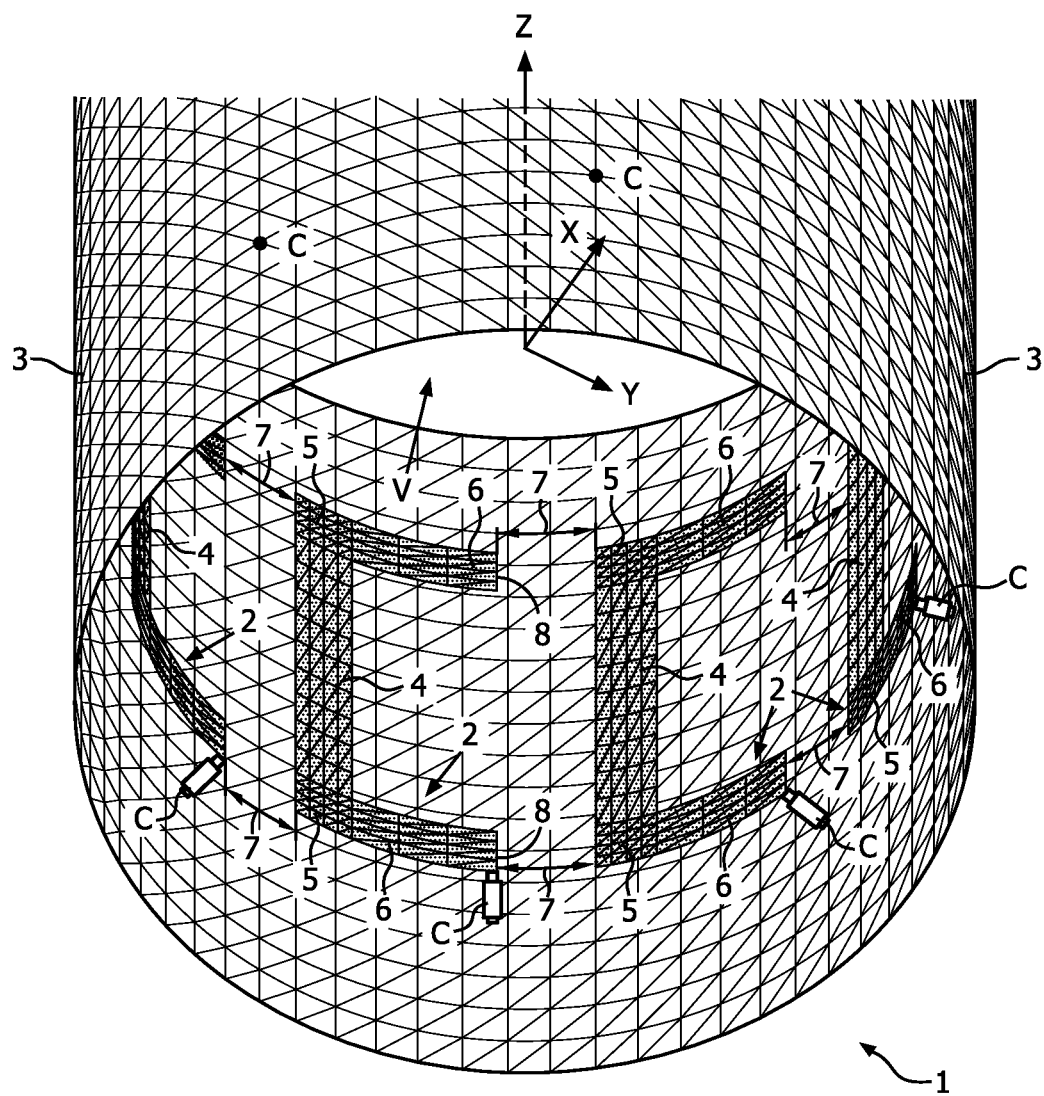
FIG. 2 shows a TEM coil according to a preferred embodiment of the invention.

With reference now to FIG. 2 of the drawings, an example of a TEM radio-frequency coil 1 for a magnetic resonance system, such as an MRI system, according to an embodiment the invention is illustrated. As was the case in FIG. 1, the TEM coil 1 of this embodiment comprises a plurality of TEM coil elements 2 arranged within and encompassed by an RF shield 3 in the form of a cylindrical screen, which functions as an RF ground for the coil 1. Again also, a central axis of the RF screen 3 corresponds to the z-axis of the coil 1. Each of the plurality of TEM coil elements 2 comprises an elongate coil strip section 4, and the TEM coil elements 2 are arranged such that the strip sections 4 are essentially parallel and spaced apart from one another at regular intervals and at the same radial spacing around the z-axis inside the RF screen 3. In this case, however, each of the opposite end regions 5 of the strip section 4 of each TEM coil element 2 has a lateral extension 6 in a direction transverse to a longitudinal extent of the respective strip section 4. In particular, the lateral extensions 6 are in the circumferential direction around the z-axis and around the circumference of the volume V for receiving the subject S surrounded or encompassed by the plurality of TEM coil elements 2.

The lateral extensions 6 from each of the opposite end regions 5 of the strip sections 4 form short circumferential or 'ring' sections and create U-shaped coil elements 2.

Significantly, the lateral extensions or ring sections 6 have been found to provide 'ring-like' current contributions which result in a clear reduction of the z-sensitivity compared with the conventional TEM coil. This is particularly apparent from FIG. 4, which illustrates the FOV for the RF coil 1 in FIG. 2 by the line designated as "U-TEM" and plotted with triangles. That is, despite being interrupted by gaps or discontinuous regions 7, the short lateral extensions or 'ring' sections 6 of the TEM coil elements 2 provide a significantly narrower field of view for the coil 1. This effect may potentially be enhanced by the circumferential alignment between the lateral extensions 6 of neighboring or adjacent coil elements 2. It will further be noted that the lateral extensions 6 from the strip section 4 of each TEM coil element 2 in FIG. 2 are connected with the screen 3 at their free ends 8 via a capacitor. In addition, the lateral extensions 6 may provide de-tuning at the opposite end regions 5 of the strip sections 4 via PIN switches to the ground of the RF screen 3.

Figure 3:
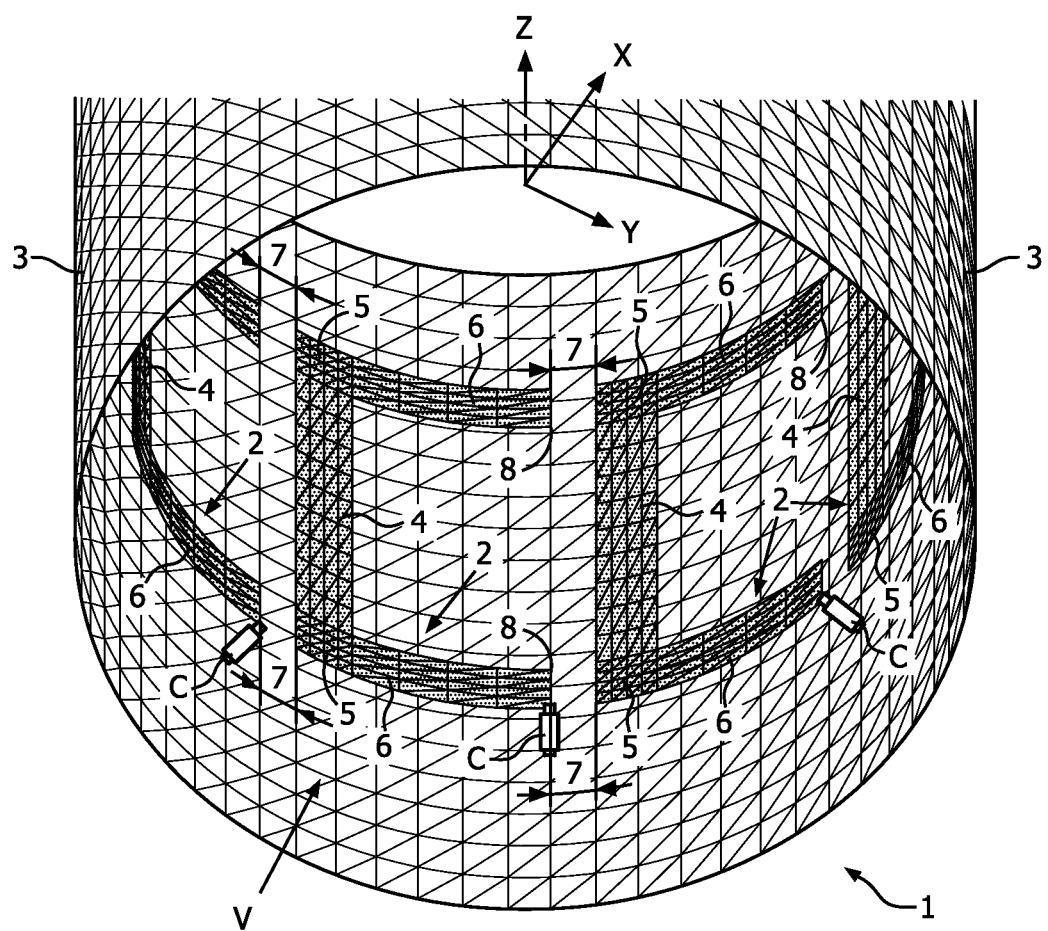
FIG. 3 shows a TEM coil according to an alternative preferred embodiment of the invention.

Referring now to FIG. 3 of the drawings, another embodiment of a TEM radio-frequency coil 1 for an MR system according to the invention is illustrated. In this embodiment, the TEM coil 1 has a similar structure to the one described with reference to FIG. 2 and like reference symbols designate like parts. Again the lateral extensions 6 are in the same circumferential direction around the z-axis and around the volume V for receiving the subject S to be analyzed, and again create U-shaped TEM coil elements 2. In this case, however, the lateral extensions or ring sections 6 are longer and extend closer to the strip section 4 of the next adjacent TEM coil element 2 in the coil 1, meaning that the gaps or discontinuous regions 7 in the circumferential bands are smaller. As is again apparent from FIG. 4 of the drawings, the result is an even more substantial reduction of the z-sensitivity of the coil 1 compared with the conventional TEM coil. In this regard, the FOV for the RF coil in FIG. 3 is represented by the line that is designated as "U-TEM (long)" and plotted with triangles. Indeed, the coil 1 in FIG. 3 has been found to provide a FOV approaching that of a QBC. Thus, it has been found that the z-profile of the field can be varied with the length of the lateral extensions or ring sections 6 of the TEM coil elements 2.

Figure 5:
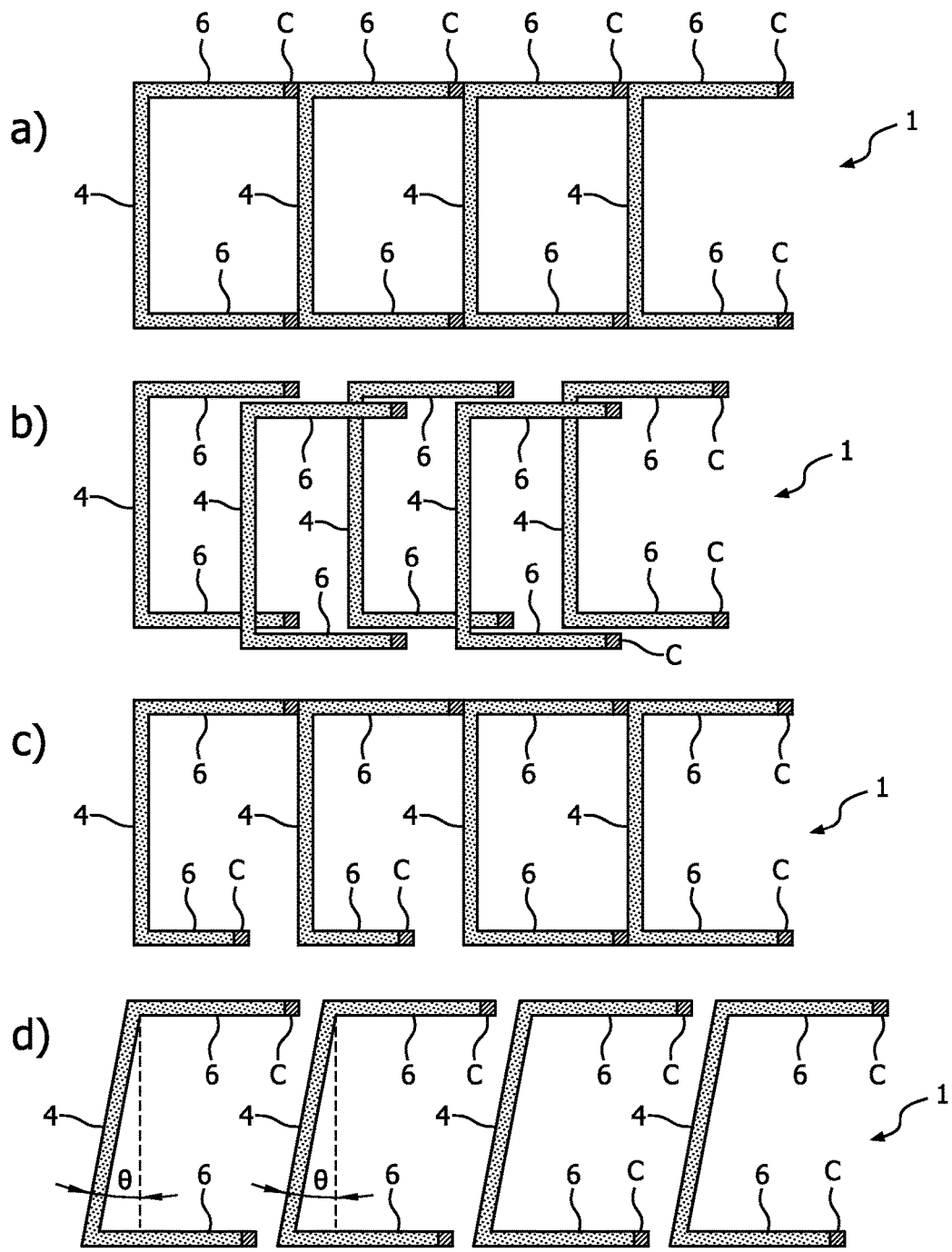
FIG. 5 shows four different embodiments (a) to (d) for a U-shaped TEM coil according to the invention.

FIG. 5 shows four different examples (a) to (d) of TEM coils or resonators 1 according to different embodiments of the invention, again comprising U-shaped TEM coil elements 2. Each U-shaped TEM coil element 2 is designed such that the lateral extensions or ring sections 6 of adjacent coil elements 2 extend in parallel and such that the resulting field of view can be designed as needed. In the embodiment (a), each ring section 6 is in circumferential alignment with the ring section 6 of a neighboring TEM coil element 2 and all the ring sections 6 are of equal length and extend to the strip section 4 of the neighboring TEM coil element 2. In the embodiment (b), the ring sections 6 are not circumferentially aligned and partly overlap with the strip section 4 of the neighboring TEM coil element 2. In the embodiment (c), the ring sections 6 at opposite end regions 5 of the same strip section 4 have different lengths. In the embodiment (d), the strip sections 4 of the TEM coil elements 2 are tilted or pitched at an acute angle θ to the z-direction. In all of the embodiments (a) to (d) the grey squares at the free ends 8 of the lateral extensions 6 denote capacitive connections C of each coil element 2 to ground (i.e. the RF-screen 3).

Figure 6:
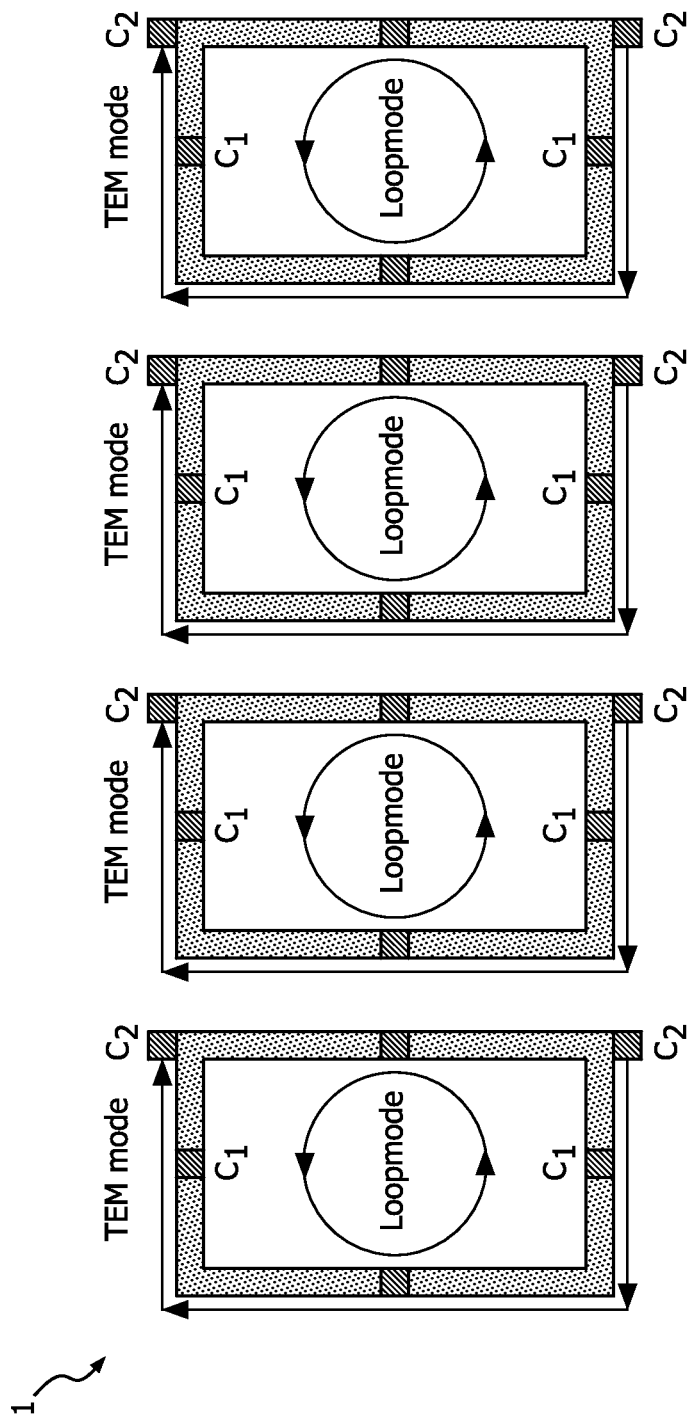
FIG. 6 shows a further embodiment of a hybrid loop, U-shaped TEM coil according to the invention.

FIG. 6 shows an embodiment of a hybrid loop/U-shaped TEM coil array according to the invention. Such a design is advantageous for multi-resonant coil arrays or for surface coil arrays. That is, the embodiment may combine a TEM structure with loop elements.

In a preferred embodiment, several truncated TEM systems can be provided along the z-direction with or without decoupling for improved imaging freedom (e.g. high channel count Tx/Rx array) in a MR system. The truncated TEM structure may be planar and may be applied as a surface Tx/Rx array. Alternatively, a truncated TEM structure may be elliptical or any other shape. The truncated TEM structure may have dimensions for fitting into a recess in the gradient coil of the MR system. This concept yields free space within the analysis cavity since the coil-elements disappear in the recess without losing the benefits of quasi-QBC field profile in z-direction. The inventive concept can be employed to retrofit the body coils of an entire installed base at all field strengths.

The proposed coil 1 described above can be created in a number of different ways. In one embodiment, a classical TEM coil $1_C$ can be equipped or fitted with lateral extensions 6 to each TEM coil element 2 such that the field contributions from these extensions 6 result in a sufficient reduction of the z-sensitivity of the coil 1. In another embodiment, the azimuthal parts of each modified TEM element can be designed in a way that ring sections 6 of neighboring TEM elements 2 run in parallel such that the resulting field more effectively reduces the FOV in z-direction. Moreover an overlap region may be designed such that decoupling of neighboring elements can be performed easily; for example, via a common capacitor or even by geometrical design (i.e. inductively). In yet another embodiment, it would be conceivable to make use of a birdcage coil. In particular, the rings of a QBC could conceivably be cut, with each rod or rung of the birdcage connected to parts of the ring extending in the same azimuthal direction. The ends of the remaining ring section could then be connected to an RF-screen. The birdcage structure would need to be re-tuned, however, such that a homogeneous current distribution across the resulting, modified TEM element could be achieved.

While the invention has been illustrated and described in detail in the drawings and foregoing description, such illustration and description are to be considered illustrative or exemplary only, and not restrictive. As such, the invention is not limited to the embodiments disclosed. Other variations to the disclosed embodiments can be understood and effected by those skilled in the art in practicing the claimed invention, from a study of the drawings, the disclosure, and the appended claims. In the claims, the word "comprising" does not exclude other features, elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST $1_C$ conventional TEM RF coil
1 TEM RF coil
2 TEM coil elements
3 RF shield or screen
4 coil strip section
5 end region of strip section
6 lateral extension or ring section 7 gap or discontinuous region
8 free end of lateral extension
C coupling connection

The invention claimed is:

1. A transverse-electromagnetic (TEM) radio-frequency coil for a magnetic resonance imaging system, wherein the coil comprises:
an electrically conductive shield disposed circumferentially around a volume configured to receive a subject to be imaged, the electrically conductive shield forming an electrical ground for resonance frequency radiation;
a plurality of TEM coil elements, each of the TEM coil elements including an elongated strip section, the elongated strip section being disposed spaced apart and parallel to each other around the volume for receiving the subject to be examined,
wherein at least one end region of the elongated strip section of each TEM coil element defines a lateral extension extending transverse to a longitudinal axis of the strip section and extending in a circumferential direction around the volume configured to receive the subject without connecting to an adjacent strip section;
wherein the lateral extension is electrically connected to the electrically conductive shield; and
wherein each TEM coil element is configured to be resonant at a resonance frequency of the magnetic resonance imaging system.

2. The radio-frequency coil of claim 1, wherein each lateral extension from the elongated strip section of each TEM coil element is in a direction around a z-axis of the electrically conductive shield and forms a discontinuous ring around the electrically conductive shield.

3. The radio-frequency coil of claim 1, wherein only one end region of the elongated strip section of each TEM coil element has a lateral extension thereby providing each TEM coil element with an L-shaped configuration.

4. A radio-frequency coil for a magnetic resonance imaging system, the coil comprising:
an electrically conductive screen configured to extend circumferentially around a volume configured to receive a subject to be imaged by the magnetic resonance imaging system, the electrically conductive screen forming an electrical ground for resonance frequency radiation,
a plurality of TEM coil elements configured to resonate at a magnetic resonance frequency of the magnetic resonance imaging system, each TEM coil element being U-shaped and including:
an elongated strip section having first and second ends, the elongated strip section extending generally adjacent the electrically conductive screen,
first and second lateral extensions extending from the first and second ends of the elongated strip section and transverse to the elongated strip section, which provides each TEM coil element with a U-shaped configuration with the extensions extending in a circumferential direction around a portion of the electrically conductive screen, wherein the first and second lateral extensions from the strip section of each TEM coil element extend in parallel in a common circumferential direction and extend towards without connecting to the strip section of an adjacent one of the plurality of TEM coil elements; and
wherein an end of one of the first and second lateral extensions is electrically connected with the electrically conductive screen.

5. The radio-frequency coil of claim 4, wherein the lateral extensions from the strip section of each TEM coil element at least partially overlap with the strip section of an adjacent one of the plurality of TEM elements.

6. The radio frequency coil according to claim 4, wherein each U-shaped TEM coil element is configured to be resonant at a resonance frequency of the magnetic resonance imaging system.

7. The radio-frequency coil of claim 4, wherein de-tuning is provided at end regions of the lateral extensions, the detuning including electrical connections to the electrical ground of the screen to form a multi-channel coil array.

8. The radio-frequency coil of claim 4, wherein the lateral extensions and the strip sections are displaced different distances from the electrically conductive screen.

9. The radio-frequency coil of claim 4, wherein the strip sections of the plurality of TEM coil elements are arranged parallel to each other and around the circumference of the electrically conductive screen at an angle offset from a longitudinal axis of the coil.

10. The radio-frequency coil of claim 4, wherein dielectric material is provided between the (1) elongated strip sections and the lateral extensions and (2) the electrically conductive screen and wherein dielectric material is provided between the (1) elongated strip sections and the lateral extensions and (2) a subject to be imaged received in the subject receiving region, the lateral extensions being electrically connected through the dielectric material with the electrically conductive screen.

11. The radio-frequency coil of claim 4, wherein two or more rings of TEM coil elements are arranged adjacent one another and spaced apart along a longitudinal axis, such that the coil includes at least two circumferential rings of TEM coil elements.

12. The radio-frequency coil of claim 4, wherein any one or more of a variety of electrical elements selected from the group of capacitors, inductors and impedance circuits is connected in series along the strip section and extensions of each TEM coil element.

13. A magnetic resonance imaging system, wherein the system incorporates the radio-frequency coil according to claim 4.

14. The radio frequency coil of claim 1, wherein the elongated strip section and the extension are formed by a strip line.

15. The radio frequency coil of claim 1, further including another extension at another end of the elongated strip section such that the TEM coil element is U-shaped.

16. The radio frequency coil of claim 15, wherein one end of the TEM coil element is electrically connected to the electrically conductive shield.

17. The radio frequency coil of claim 16, wherein the TEM coil element is one of a strip line coil element and a dipole element with capacitive end loading.

18. A magnetic resonance imaging system including the radio frequency coil of claim 1.

* * * * *